(12) United States Patent  
Sirito-Olivier

(10) Patent No.: US 7,408,418 B2
(45) Date of Patent: Aug. 5, 2008

(54) PHASE LOCKED LOOP CIRCUIT HAVING REDUCED LOCK TIME

(75) Inventor: Philippe Sirito-Olivier, Carro par Martigues (FR)

(73) Assignee: STMicroelectronics SA, Montrouge (FR)

( * ) Notice: Subject to any disclaimer, the term of this patent is extended or adjusted under 35 U.S.C. 154(b) by 106 days.

(21) Appl. No.: 11/480,757

(22) Filed: Jun. 30, 2006

(65) Prior Publication Data

US 2007/0018735 A1   Jan. 25, 2007

(30) Foreign Application Priority Data

Jun. 30, 2005   (EP) ................... 05291442

(51) Int. Cl.
  *H03L 7/093*   (2006.01)
  *H03D 3/02*   (2006.01)

(52) U.S. Cl. ............... 331/17; 331/23; 329/325

(58) Field of Classification Search ............. 331/1 A, 331/17, 18, 25, 23; 327/156–159; 332/127; 360/51; 375/376; 455/260; 329/325
  See application file for complete search history.

(56) References Cited

U.S. PATENT DOCUMENTS 5,382,922 A    1/1995   Gersbach et al.
5,631,601 A    5/1997   Horsfall et al.
6,476,681 B1 * 11/2002  Kirkpatrick ............... 331/17
6,826,246 B1  11/2004   Brown et al.

FOREIGN PATENT DOCUMENTS

DE    199 17 585 A1   11/2000

OTHER PUBLICATIONS

European Search Report for EP 05 29 1442 dated Oct. 5, 2005.

* cited by examiner

*Primary Examiner*—David Mis
(74) *Attorney, Agent, or Firm*—Lisa K. Jorgenson; Bryan A. Santarelli; Graybeal Jackson Haley LLP

(57) ABSTRACT

A phase locked loop circuit comprising a phase detector having a first input for receiving a first frequency signal and an output, a first filter adapted to filter the output electric signal of the phase detector, a voltage controlled oscillator adapted to generate a second frequency signal in response to the output filtered signal of the phase detector. The phase detector has a second input for receiving the second frequency signal and is adapted to compare it with the first frequency signal. The circuit comprises means adapted to amplify the difference between an electric signal coupled with the output of the phase detector and a reference electric signal and a second filter adapted to receive the output electric signal of the amplification means and to send an output electric signal to the voltage controlled oscillator. The circuit comprises further means adapted to modify the value of the electric signal in input to the second filter to decrease the response time of the second filter.

28 Claims, 4 Drawing Sheets

PHASE LOCKED LOOP CIRCUIT HAVING REDUCED LOCK TIME

PRIORITY CLAIM

This application claims priority from European patent application No. 05291442.1, filed Jun. 30, 2005, which is incorporated herein by reference.

TECHNICAL FIELD

An embodiment of the present invention refers to a phase-locked-loop circuit.

BACKGROUND

Phase-locked-loop circuits or PLL circuits are known in the state of the art which are employed in numerous electronic appliances as, for example, in modulators or demodulators of medium frequency signals or FM signals. Generally a PLL circuit comprises a phase detector having in input a reference frequency and a frequency deriving from a voltage controlled oscillator or VCO, a filter having in input the output signal of the phase detector and outputting a signal in input to the VCO.

A parameter of the PLL circuits is the lock time, that is the time period employed by the circuit to obtain that the output frequency of the VCO becomes equal to the reference frequency. The lock time is inversely proportional to the bandwidth of the circuit; for the PLL circuits used, for example, in FM modulators where the bandwidth of the PLL circuit is about 10 Hz, the lock time is high, that is of some seconds.

Also, during the lock phase of the PLL circuit, the output frequency changes thereby producing interferences in adjacent channels, in the case of a multi-channel FM modulator, and it produces higher noise in the receiver channel. The lock time should be kept low for reducing said perturbations.

A known circuit that lowers the lock time is the PLL circuit which uses a charge pump as shown in FIG. 1. Said circuit comprises a digital phase/frequency detector or PFD (Phase Frequency Detector) 4 having in input a digital reference frequency Fref1 and a digital frequency fv and which has two outputs UP and DOWN to be enabled if the reference frequency Fref1 is respectively higher or lower than the frequency fv. The two outputs UP and DOWN control respective current generators adapted to send a current to a filter 1 having a narrow bandwidth; the phase detector 4 and the current generators act as a current-pump charger. The output voltage signal of the filter 1 is the control signal of the VCO 2, which outputs a frequency of Fout, which is in input to a frequency divider 3 for obtaining the frequency fv. The increase of the current in input to the filter allows an increase of the bandwidth of the filter 1 and a decrease of the lock time. After the lock phase, the charge pump's current is turned back to its normal value to assure the stability of the PLL circuit.

Said circuit is of easy design and the charge pump's current can be controlled easily by means of a microcontroller; however, the circuit has a reduced stability both in the lock phase and during the other successive phases and it may also be difficult to optimize the current-boost time for reducing the lock time to its minimum.

Another circuit solution with a PLL is described in U.S. Pat. No. 5,631,601, which is incorporated by reference. Said patent discloses a PLL circuit adapted to demodulate a FM carrier wave; the circuit comprises a phase detector and a VCO having in input the output signal of the phase detector and adapted to provide a signal in input to the phase detector for comparison with said FM carrier wave. The PLL circuit comprises a variable gain circuit operable to select a desired gain for the PLL and to select a bandwidth for demodulation by the circuit. The circuit of the U.S. Pat. No. 5,631,601 comprises a synthesizer adapted to regulate the PLL at a given frequency; the synthesizer provides a voltage signal in input to the VCO to bring the output frequency of the VCO equal to that of the required carrier. The synthesizer is a circuital element which is of complex provision and requires the use of a determined space in the chip wherein the PLL is implemented.

SUMMARY

In view of the state of the art described, an embodiment of the present invention provides a phase-locked-loop circuit which is simpler than the known PLL circuits.

An embodiment of the present invention comprises a phase detector having a first input for receiving a first frequency signal and an output, a first filter adapted to filter the output electric signal of said phase detector, a voltage controlled oscillator adapted to generate a second frequency signal in response to the output filtered signal of said phase detector, said phase detector having a second input for receiving said second frequency signal and being adapted to compare it with said first frequency signal, further comprising means adapted to amplify the difference between an electric signal coupled with the output of the phase detector and a reference electric signal and a second filter adapted to receive the output electric signal of said amplification means and to send an output electric signal to said voltage controlled oscillator, said circuit comprising further means adapted to modify the value of the electric signal in input to said second filter to decrease the response time of said second filter.

Thanks to an embodiment of the present invention, it is possible to form a phase-locked-loop circuit which is more economic and less complex than the prior art circuits.

BRIEF DESCRIPTION OF THE DRAWINGS

Features and advantages of the present invention will be made evident by the following detailed description of embodiments thereof, shown as non limiting examples in the annexed drawings.

DETAILED DESCRIPTION

Figure 1:
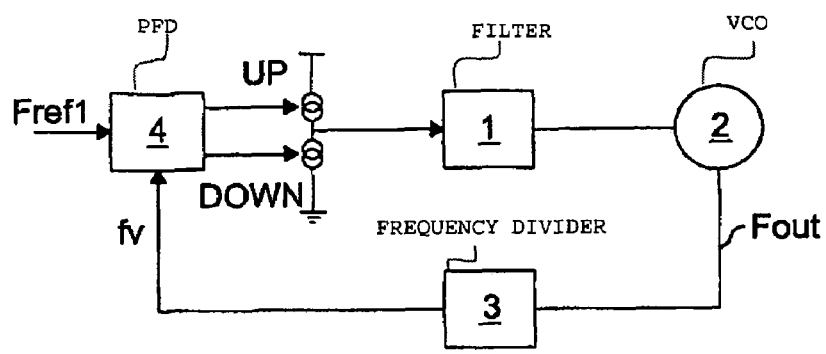
FIG. 1 is a schematic diagram of a PLL according to prior art.
Figure 2:
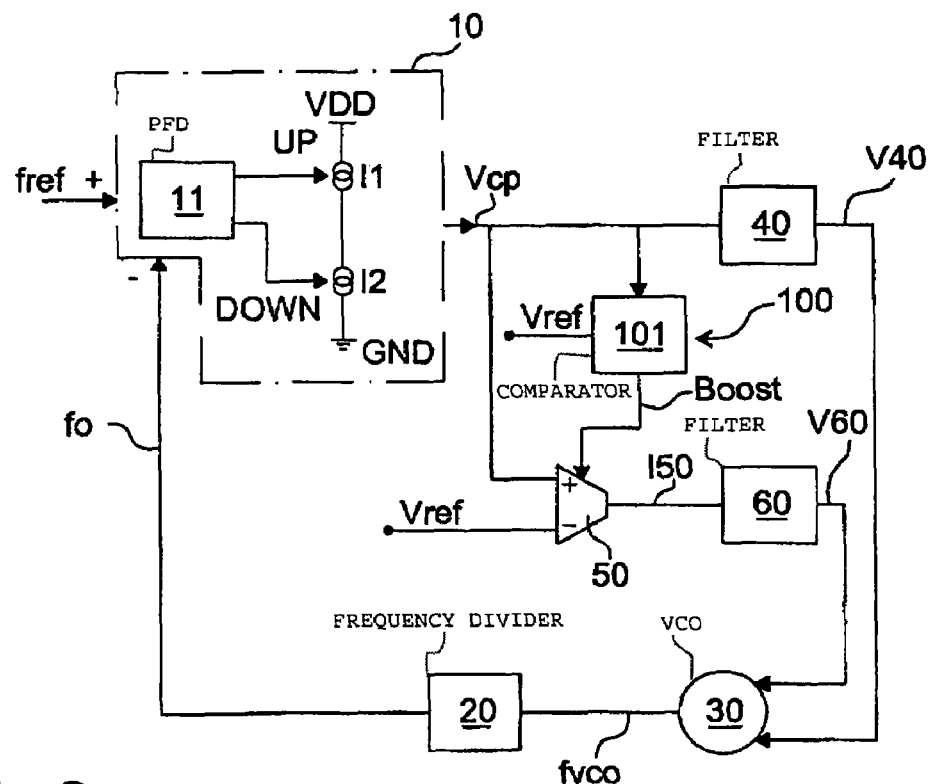
FIG. 2 is a schematic diagram of a phase-locked-loop circuit according to an embodiment of the invention.

In FIG. 2, a phase-locked-loop circuit according to a first embodiment of the present invention is shown. Said circuit comprises a phase detector 10 having in input a reference frequency fref and a frequency fo deriving from a frequency divider 20 having an input frequency fvco deriving from a voltage controlled oscillator or VCO 30. The phase detector 10 comprises a known phase/frequency detector or PFD 11 of the digital type which has two outputs UP and DOWN to be respectively enabled if the reference frequency fref is higher or lower than the frequency fo. Two outputs UP and DOWN control respective current generators I1 and I2 arranged along a circuit line between a supply voltage VDD and ground; the phase detector 10 generates an output voltage signal Vcp. The phase detector 10 may comprise a charge pump, for example, a Gilbert's cell.

The signal Vcp, in a first circuit path, is in input to a filter 40 having a given bandwidth, the output signal V40 of which is in input to the VCO 30.

The filter 40 can be formed by means of a first circuit branch in parallel with a second circuit branch which are arranged between the voltage Vcp and ground GND; the first circuit branch comprises a resistance and a capacitor while the second circuit branch comprises a capacitor.

The filter 40 can be formed even by means of a resistance in parallel with a capacitor, which are arranged between a voltage Vcp and a circuit node, and a resistance arranged between said circuital node and ground GND.

The circuit in FIG. 2 comprises means 50 adapted to amplify the difference between an electric signal Vout and the output Vcp of the phase detector, and a second filter 60 adapted to receiver the output electric signal of said amplification means 50 and adapted to send an output electric signal V60 to said voltage controlled oscillator 30. In one example, the second filter 60 has a bandwidth smaller than that of the first filter 40 to assure the stability of the phase-locked-loop circuit.

In fact, in a second circuit path, the signal Vcp and a reference signal Vref are in input to a transconductance amplifier 50. The amplifier 50 generates a current signal I50 if the signal Vcp is different from the signal Vref. The signal I50 is adapted to charge the filter 60 having a bandwidth smaller than the bandwidth of the filter 40, preferably with a rate of 1%0 with respect to the bandwidth of the filter 40; this maintains the stability of the PLL circuit. The filter 60 generates a signal V60 in input to the VCO 30. The filter 60 can be formed by means of a capacitor connected between ground GND and the circuit line through which the current I50 passes.

The VCO 30 receives the signals V60 and V40 in output from the filters 60 and 40 and produces the frequency fvco. The VCO 30 may comprise means adapted to multiply the voltages V40 and V60 by two different gains G40 and G60 and means adapted to sum the two voltage so multiplied; the voltage V=V40*G40+V60*G60 is the control voltage used by the VCO 30 to determine the frequency fvco. Alternatively, G40 may equal G60.

The circuit in FIG. 2 comprises means 100 adapted to modify the value of the electric signal in input to the filter 60 to decrease its response time, that is to change more quickly the value of the electric signal V60 in output from the filter 60; particularly the means 100 are adapted to change the current I50 in input to the filter 60 if the absolute value of the difference between the signal Vcp and the reference signal Vref is higher than a given value Vf, which is for example 0.2 Volt.

In the operation phase of the PLL, after the lock has occurred, the voltages Vcp and Vref are equal or approximately equal, the amplifier 50 supplies little or no current to the filter 60, and the voltage V60 is kept relatively constant. Small variations of the frequency fvco in output from the VCO 30 are corrected by means of the loop formed by the phase detector 10, the filter 40, the VCO 30 and the frequency divider 20.

In the lock phase the voltage Vcp is different from the voltage Vref, the amplifier 50 sends a current I50 to the filter 60 to charge it and to obtain a fast response; the value of the voltage V60 is changed more quickly and arrives more quickly to the VCO 30.

If the difference Vcp−Vref is higher than Vf or lower than −Vf, the means 100 respectively increase or decrease the current in input to the filter 60 to obtain a response in shorter time. In such a way the voltage V60 is changed in a short time.

In FIG. 2 the means 100 comprises a window comparator 101 adapted to compare the voltages Vref and Vcp and to send a signal Boost to the amplifier 50 if the voltage Vcp−Vref is higher than Vf or is lower than −Vf. The signal Boost acts on the amplifier to increase the transconductance gain Gm. The current I50 will be higher in absolute value so that the filter 60 responds faster and the new voltage V60 is sent faster to the VCO 30. This allows a decrease in the lock time Tc with respect to PLL circuits of the prior art.

Figure 3:
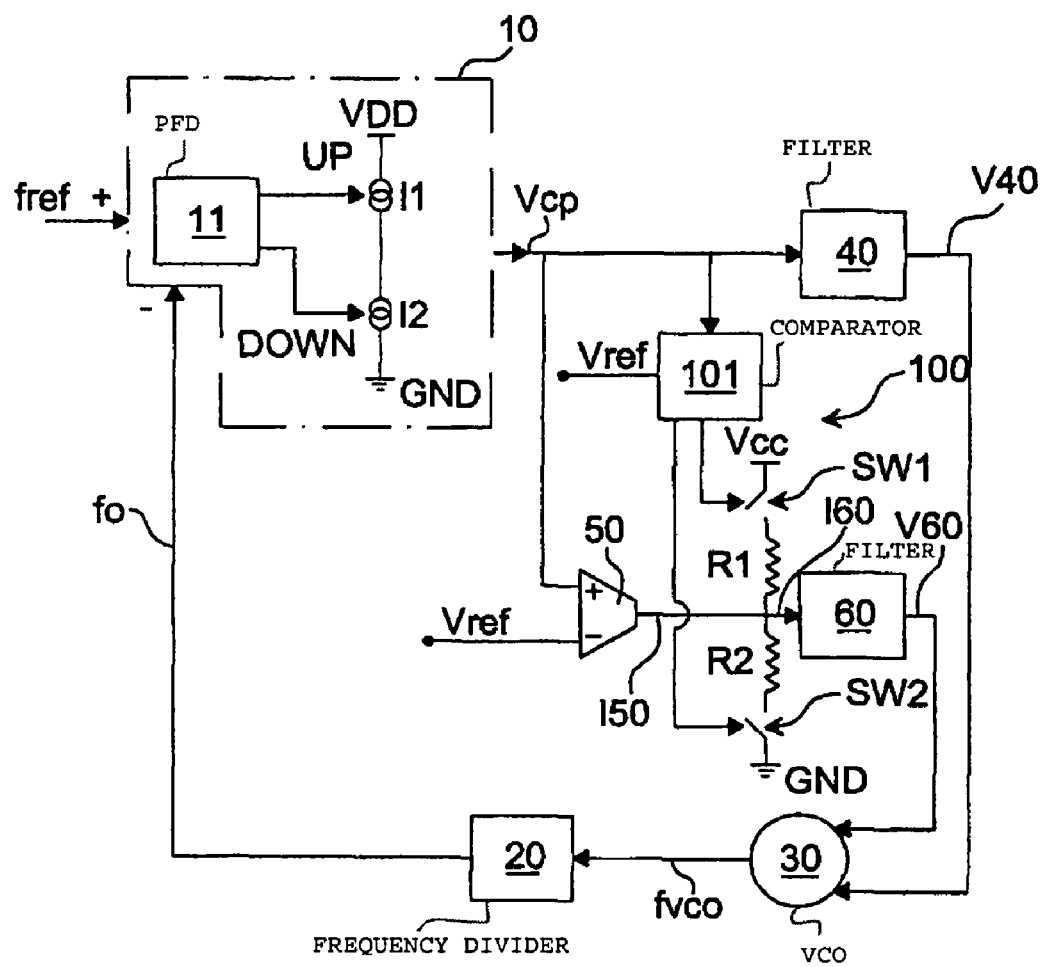
FIG. 3 is a schematic diagram of a phase-locked-loop circuit according to another embodiment of the invention.

In FIG. 3 a phase-locked-loop circuit according to a second embodiment of the invention is shown. The only difference of the circuit in FIG. 3 with respect to the circuit of the first embodiment shown in FIG. 2 is the different circuit structure of the means 100. The means 100 of FIG. 3 comprises a window comparator 101 adapted to compare the voltage Vcp and Vref and a circuit branch arranged between a supply voltage Vcc and ground GND and which comprises a switch SW1, the series of two resistances R1 and R2, and a switch SW2. The output terminal of the amplifier 50 and the input of the filter 60 are connected with the intermediate node between the resistances R1 and R2. If the voltage Vcp−Vref is lower than −Vf the comparator 101 closes the switch SW2 and opens the switch SW1 while if the voltage Vcp−Vref is higher than Vf the comparator 101 closes the switch SW1 and opens the switch SW2. The absolute value of the current I60 in input to the filter 60 will be higher than the absolute value of the current I50 in output from the amplifier 50 with the use of said circuit branch, so that the filter 60 responds faster and the new voltage V60 is sent faster to the VCO 30. This allows a decrease of the lock time Tc with respect to the known PLL circuits.

In a variant to the embodiments described in FIGS. 2 and 3 both the amplifier 50 and the means 100 have in input the voltage V40 in the place of the voltage Vcp.

Figure 4:
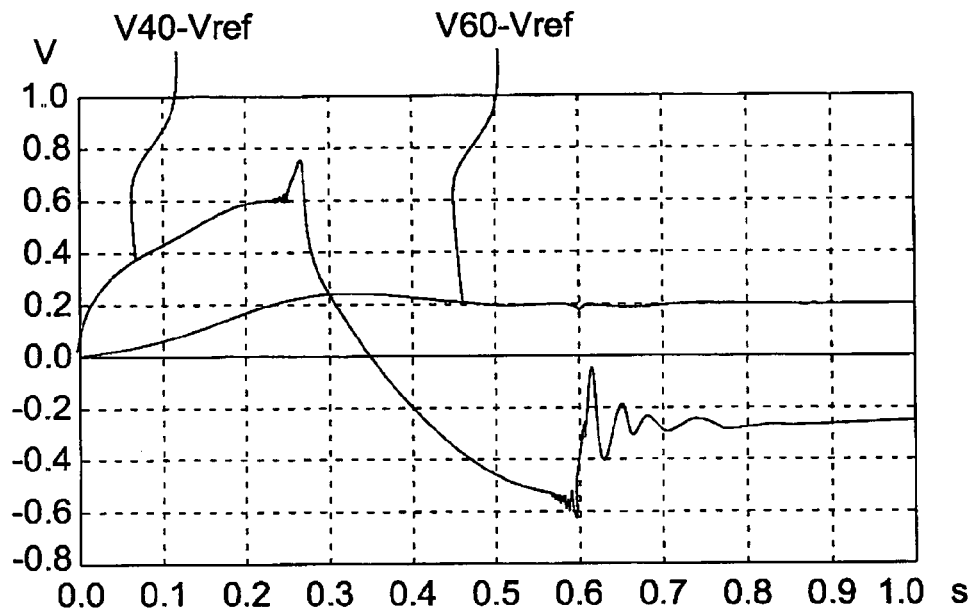
FIGS. 4 and 5 are timing diagrams of signals operating in the circuit of FIG. 2 without use of means 100 according to an embodiment of the invention.
Figure 5:
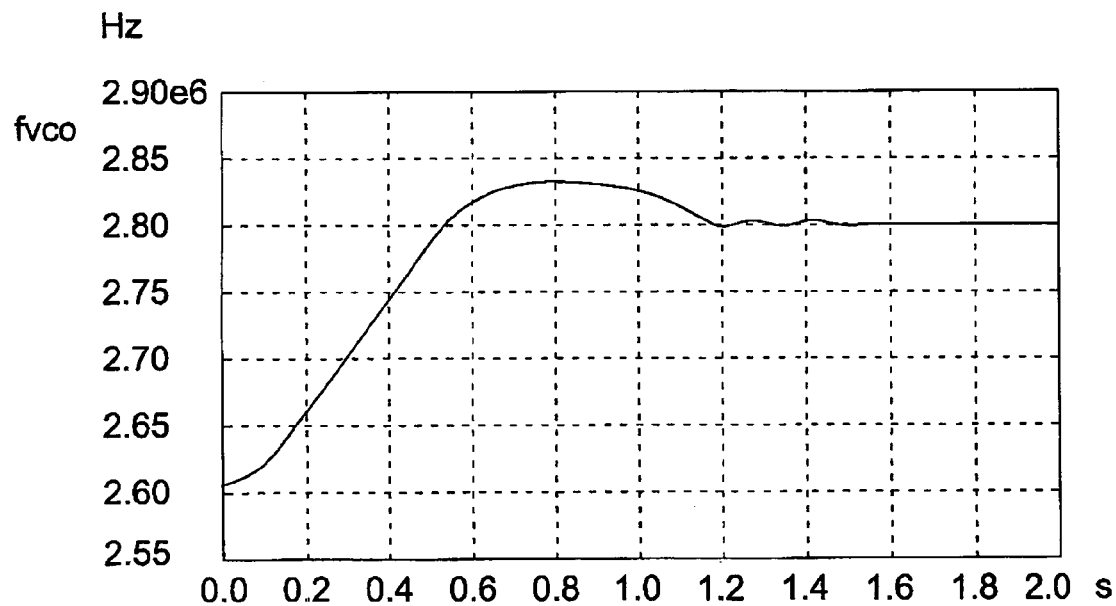

FIGS. 4 and 5 show the time diagrams of the voltages V40−Vref and V60−Vref and the frequency fvco for the phase-locked-loop circuit in FIG. 2 without the use of the means 100. It is noticed that the settling time or lock time is about 1.5 s.

Figure 6:
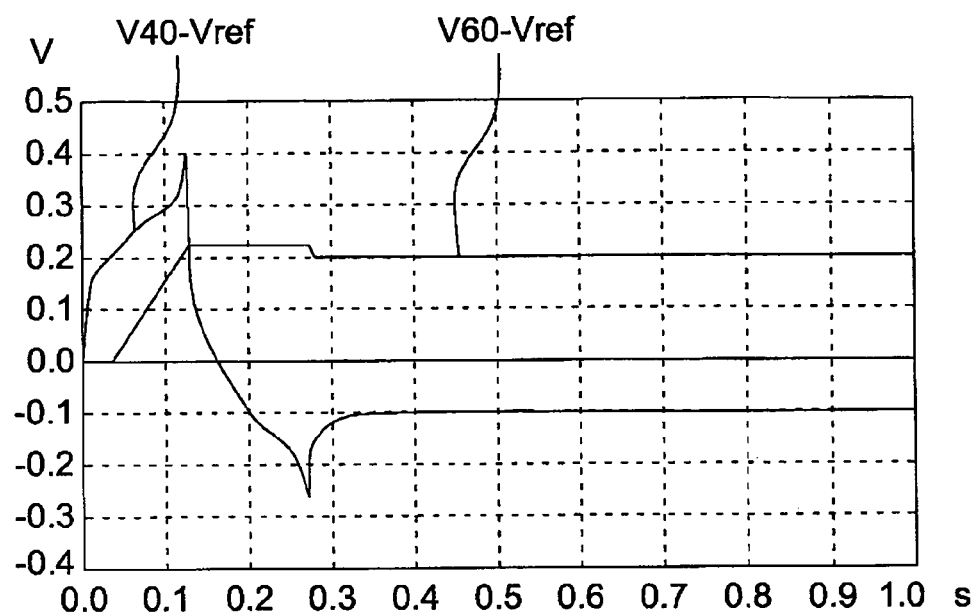
FIGS. 6 and 7 are timing diagrams of the same signals of FIGS. 4 and 5 but for the phase-locked-loop circuit in FIG. 2 with use of means 100 according to an embodiment of the invention.
Figure 7:
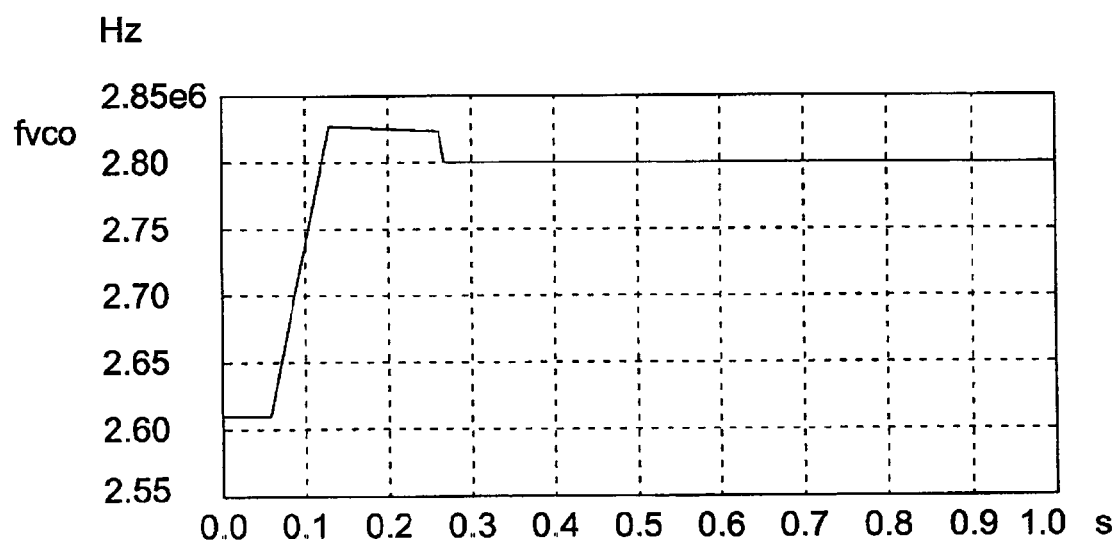

FIGS. 6 and 7 show the time diagrams of the voltages V40−Vref and V60−Vref and the frequency fvco for the phase locked loop circuit in FIG. 2 with the use of the means 100. It is noticed that the settling time or lock time is decreased and it is about 0.3 s.

One or more of the PLLs FIG. 2, the PLL of FIG. 3, or both the PLL of FIG. 2 and the PLL of FIG. 3, may be incorporated into an integrated circuit (IC) such as an FM modulator or demodulator, and such an IC may be incorporated into an electronic system such as an FM radio receiver or transmitter.

From the foregoing it will be appreciated that, although specific embodiments of the invention have been described herein for purposes of illustration, various modifications may be made without deviating from the spirit and scope of the invention.

What is claimed is:

1. Phase locked loop circuit comprising a phase detector having a first input for receiving a first frequency signal and an output, a first filter adapted to filter the output electric signal of said phase detector, a voltage controlled oscillator adapted to generate a second frequency signal in response to the output filtered signal of said phase detector, said phase detector having a second input for receiving said second frequency signal and being adapted to compare it with said first frequency signal, further comprising means adapted to amplify the difference between an electric signal coupled with the output of the phase detector and a reference electric signal and a second filter adapted to receive the output electric signal of said amplification means and to send an output electric signal to said voltage controlled oscillator, said circuit comprising further means adapted to modify the value of the electric signal in input to said second filter to decrease the response time of said second filter.

2. Circuit according to claim 1 wherein said further means comprising a window comparator adapted to compare said electric signal coupled with the output of said phase detector with said reference electric signal.

3. Circuit according to claim 2 wherein said amplification means have a given gain and said window comparator is adapted to modify the gain of said amplification means if the absolute value of the difference between said electric signal coupled with the output of said phase detector and said reference electric signal is higher than a given value.

4. Circuit according to claim 2 wherein said further means comprises a circuit branch connected with the input of said second filter, said circuit branch comprising active and passive elements, said window comparator acting on said active elements if the absolute value of the difference between said electric signal coupled with the output of said phase detector and said reference electric signal is higher than a given value.

5. Circuit according to claim 4 wherein said circuit branch comprises the series of a first switch, a first resistance, a second resistance and a second switch, the common terminal between said two resistances being connected with the input of said second filter, said series being arranged between a supply voltage and a further reference voltage, said window comparator acting on said switches.

6. Circuit according to claim 1 wherein said first filter has a given bandwidth and said second filter has a bandwidth smaller than that of said first filter.

7. Circuit according to claim 1 wherein said electric signal coupled with the output of said phase detector is the electric signal in input to the first filter.

8. Circuit according to claim 1 wherein said electric signal coupled with the output of said phase detector is the electric signal in output from the first filter.

9. A phase-locked loop, comprising:
a phase-detector circuit operable to generate a first error signal from a difference between a reference frequency and a feedback frequency;
a first filter circuit coupled to the phase-detector circuit and operable to generate a first control signal from the first error signal;
a second filter circuit coupled to the phase-detector circuit and operable to generate a second control signal from a difference between the first error signal and a reference value; and
an oscillator circuit coupled to the first and second filter circuits and operable to generate the feedback frequency from the first and second control signals.

10. The phase-locked loop of claim 9 wherein the phase-detector circuit comprises:
a phase-frequency detector operable to generate a phase-difference signal from the difference between the reference and feedback frequencies; and
a charge pump coupled to the phase-frequency detector and operable to generate from the phase-difference signal a current as the first error signal.

11. The phase-locked loop of claim 9 wherein:
the first filter circuit comprises a first low-pass filter having a first bandwidth; and
the second filter circuit comprises a second low-pass filter having a second bandwidth that is lower than the first bandwidth.

12. The phase-locked loop of claim 9 wherein the second filter circuit comprises:
an amplifier operable to generate a second error signal from a difference between the first error signal and the reference value; and
a low-pass filter coupled to the amplifier and operable to generate the second control signal from the second error signal.

13. The phase-locked loop of claim 9 wherein the second filter circuit has an adjustable gain and is further operable to increase the gain in response to a magnitude of a difference between the first error signal and the reference value exceeding a predetermined value.

14. The phase-locked loop of claim 9 wherein the second filter circuit comprises:
an amplifier having an adjustable gain and operable to generate a second error signal from a difference between the first error signal and the reference value;
a low-pass filter coupled to the amplifier and operable to generate the second control signal from the second error signal; and
a boost circuit coupled to the amplifier and operable to increase the gain of the amplifier in response to a magnitude of a difference between the first error signal and the reference value exceeding a predetermined value.

15. The phase-locked loop of claim 9 wherein the second filter circuit comprises:
an amplifier operable to generate a second error signal from a difference between the first error signal and the reference value;
a boost circuit operable to generate a boost signal in response to a magnitude of a difference between the first error signal and the reference value exceeding a predetermined value; and
a low-pass filter coupled to the amplifier and to the boost circuit and operable to generate the second control signal from a sum of the second error signal and the boost signal.

16. The phase-locked loop of claim 9 wherein the oscillator circuit is operable to generate the feedback frequency from a sum of a product of the first control signal and a first gain and a product of the second control signal and a second gain.

17. The phase-locked loop of claim 9 wherein the oscillator circuit comprises:
a signal-controlled oscillator operable to generate an intermediate frequency from the first and second control signals; and
a divider coupled to the oscillator and operable to generate the feedback frequency from the intermediate frequency.

18. The phase-locked loop of claim 9 wherein the phase-detector circuit is operable to receive a frequency-modulated signal having the reference frequency.

19. The phase-locked loop of claim 9 wherein the reference value comprises a reference voltage.

20. An integrated circuit, comprising:
a phase-locked loop, including,
a phase-detector circuit operable to generate a first error signal from a difference between a reference frequency and a feedback frequency, a first filter circuit coupled to the phase-detector circuit and operable to generate a first control signal from the first error signal, a second filter circuit coupled to the phase-detector circuit and operable to generate a second control signal from a difference between the first error signal and a reference value, and an oscillator circuit coupled to the first and second filter circuits and operable to generate the feedback frequency from the first and second control signals.

21. A system, comprising:
an integrated circuit, including,
a phase-locked loop, including,
a phase-detector circuit operable to generate a first error signal from a difference between a reference frequency and a feedback frequency,
a first filter circuit coupled to the phase-detector circuit and operable to generate a first control signal from the first error signal,
a second filter circuit coupled to the phase-detector circuit and operable to generate a second control signal from a difference between the first error signal and a reference value, and
an oscillator circuit coupled to the first and second filter circuits and operable to generate the feedback frequency from the first and second control signals.

22. A method, comprising:
generating a first error signal from a difference between a reference frequency and a feedback frequency;
generating a first control signal from the first error signal;
generating a second control signal from a difference between the first error signal and a reference value; and
generating the feedback frequency from the first and second control signals.

23. The method of claim 22 wherein:
generating the first control signal comprises limiting the first error signal to a first bandwidth and generating the first control signal from the bandwidth-limited first error signal; and
generating the second control signal comprises limiting the difference between the first error signal and the reference value to a second bandwidth that is lower than the first bandwidth and generating the second control signal from the bandwidth-limited difference.

24. The method of claim 22 wherein generating the second control signal comprises:
amplifying a difference between the first error signal and the reference value;
generating a second error signal from the amplified difference;
limiting the bandwidth of the second error signal; and
generating the second control signal from the bandwidth-limited second error signal.

25. The method of claim 22 wherein generating the second control signal comprises:
amplifying the difference between the first error signal and the reference value by an amplification factor;
generating a boost signal in response to a magnitude of the difference between the first error signal and the reference value exceeding a predetermined value;
summing the amplified difference and the boost signal;
limiting the bandwidth of the sum; and
generating the second control signal from the bandwidth-limited sum.

26. The method of claim 22 wherein generating the feedback frequency comprises generating the feedback frequency from a sum of a product of the first control signal and a first amplification factor and a product of the second control signal and a second amplification factor.

27. The method of claim 22 wherein generating the feedback frequency comprises:
generating an intermediate frequency from the first and second control signals; and
reducing the intermediate frequency to generate the feedback frequency.

28. The method of claim 22, further comprising:
receiving a frequency-modulated signal having the reference frequency;
wherein generating the first error signal comprises demodulating the frequency-modulated signal; and
wherein the first error signal comprises a demodulated version of the frequency-modulated signal.

* * * * *